United States Patent [19]

Beaman

[11] Patent Number: 5,606,358
[45] Date of Patent: Feb. 25, 1997

[54] LIGHT-EMITTING DIODE PRINTHEAD

[75] Inventor: Bryan A. Beaman, Churchville, N.Y.

[73] Assignee: Eastman Kodak Company, Rochester, N.Y.

[21] Appl. No.: 812,094

[22] Filed: Dec. 23, 1991

[51] Int. Cl.⁶ ..................................................... B41J 2/435
[52] U.S. Cl. ........................................................ 347/237
[58] Field of Search ....................... 346/107 R; 361/414, 361/412, 784, 803; 174/255, 250; 347/130, 132, 237, 238

[56] References Cited

U.S. PATENT DOCUMENTS

| | | | |
|---|---|---|---|
| 4,522,667 | 6/1985 | Hanson et al. | 428/601 X |
| 4,536,778 | 8/1985 | De Schamphelaere et al. | 346/107 R X |
| 4,866,507 | 9/1989 | Jacobs et al. | 357/74 |
| 4,875,057 | 10/1989 | Hediger et al. | 346/107 R |
| 4,904,968 | 2/1990 | Theus | 333/246 |
| 4,905,021 | 2/1990 | Iizuka et al. | 346/107 R |
| 4,942,405 | 7/1990 | Dody et al. | 346/107 R |
| 5,072,075 | 12/1991 | Lee et al. | 174/264 |
| 5,079,567 | 1/1992 | Beaman et al. | 346/107 R |

FOREIGN PATENT DOCUMENTS

91/10211  7/1991  WIPO .

*Primary Examiner*—Benjamin R. Fuller
*Assistant Examiner*—David Yockey
*Attorney, Agent, or Firm*—Norman Rushefsky

[57] ABSTRACT

A non-impact printhead is formed of modules. Each module comprises a tile support that has mounted thereon a plurality of LED chip arrays and driver chip arrays for driving the LEDs. A spreader board is also mounted on the tile for distributing signals to the driver chips. A ground connection between the LEDs and the spreader board is made without relying upon electrical conductivity through the tile and a mother board which supports several tiles. Rather, a ground path is provided by a conductive layer upon the tile. In one embodiment, a via in the spreader board connects this ground path with the top surface of the spreader board. In a second embodiment, the ground path continues along a bottom surface of the spreader board to a ground strip of a bus bar.

10 Claims, 3 Drawing Sheets

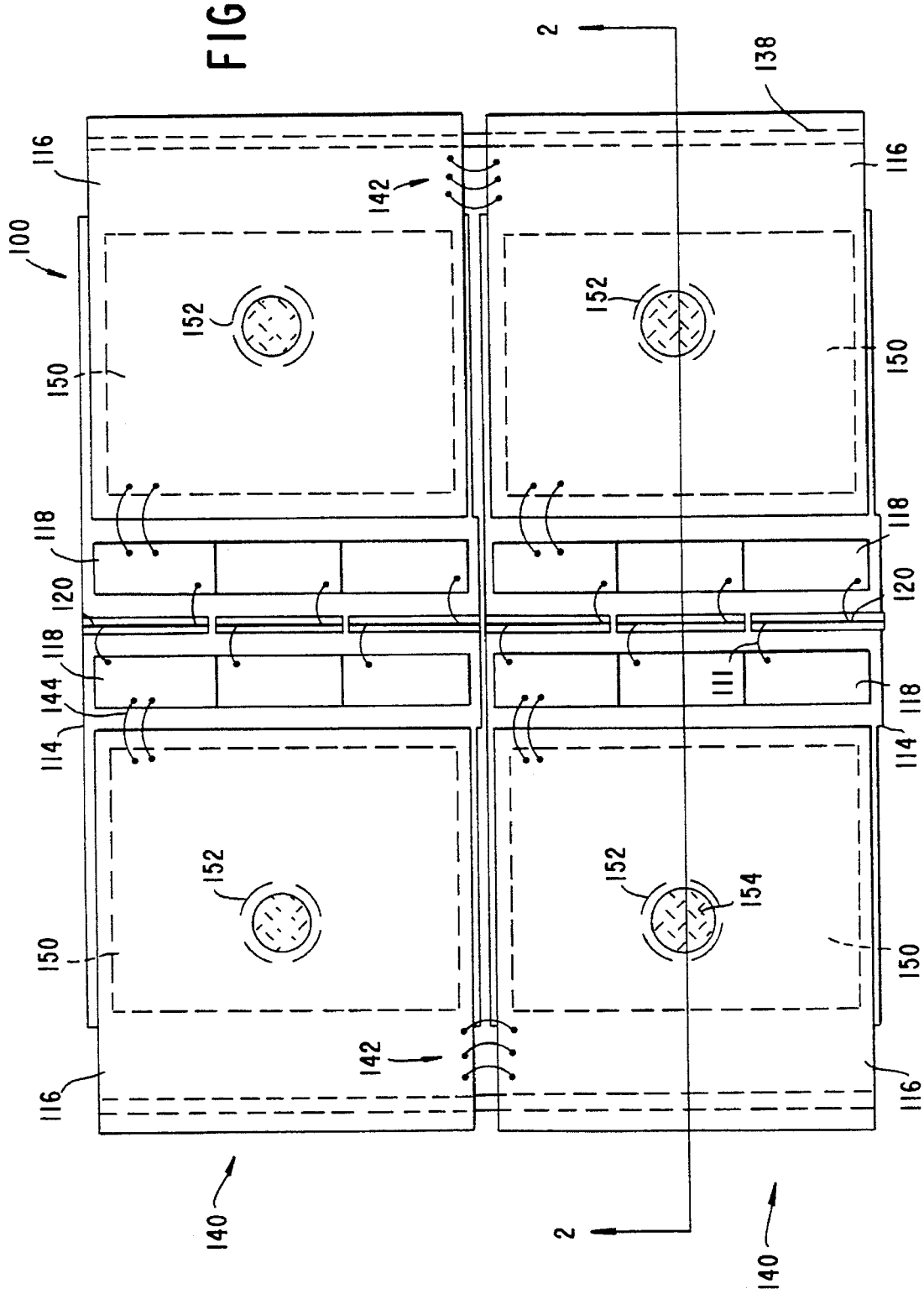

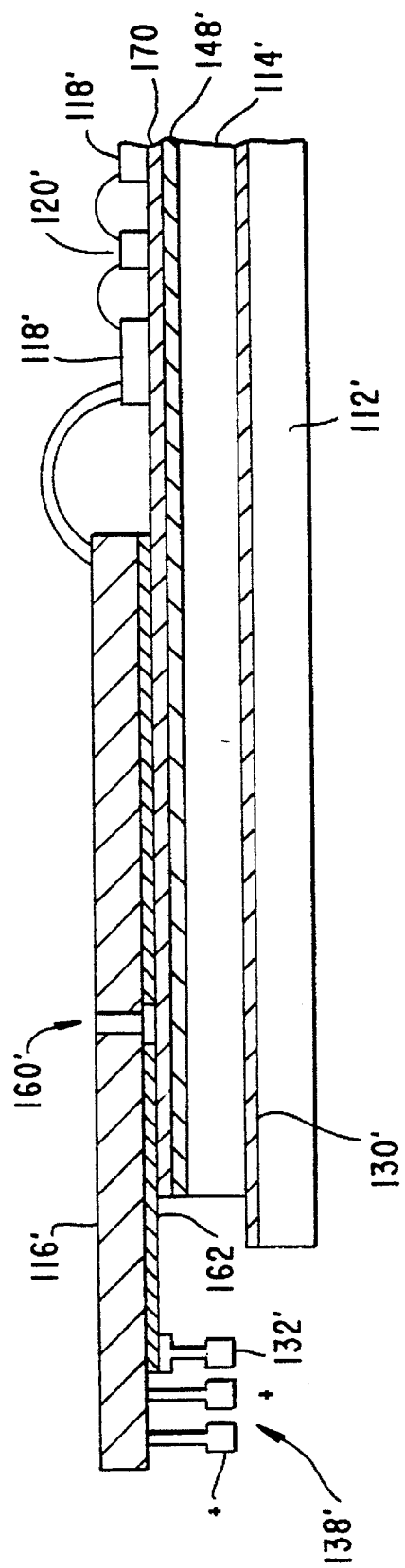

LIGHT-EMITTING DIODE PRINTHEAD

FIELD OF THE INVENTION

The invention relates to a printhead, particularly a light-emitting diode (LED) printhead that has improved structure for establishing a ground or other signal through the LED.

DESCRIPTION OF THE PRIOR ART

In PCT International Patent Publication No. 91/10211, the contents of which are incorporated herein by this reference, an LED printhead is described that is comprised of a plurality of modules assembled side to side in the form of a row. On each module is a row of LEDs formed by LEDs on three LED chip arrays that are assembled end to end. Driver chips on each side of the row of LEDs are provided with current-driving circuits and logic circuits for receiving data signals and selectively enabling certain LEDs to be provided with controlled amounts of current to cause the selected LEDs to emit light for particular controlled time periods to record an image on a recording medium. Typically, the recording medium is positioned either close to the LEDs or a lens is used to focus light from the LEDs onto the recording medium that is spaced from the recording medium.

With reference now to FIG. 1, there is illustrated a schematic in cross-section of a portion of the printhead (10) described in the aforementioned publication. As may be seen from FIG. 1, a metallic mother board (12) supports a series of modules with a portion of one module being shown. The support for each module comprises a metallic tile (14) or pallet. Upon the tile there are mounted two spreader boards (16) (only one of which is shown), six driver chip arrays (18) (only one of which is shown) and three LED chip arrays (20). As described more fully in the above publication, the spreader board is a multilayer circuit board that receives signals and power and ground and couples same through appropriate wire bonds (only power and ground wire bonds 22, 24 are illustrated) to appropriate input pads on the driver chip arrays. The driver chips are also connected by wire bonds 26 (only one of which is illustrated) to the LED chip arrays to provide driver current. Typically, the LEDs have a common cathode ground that is formed by metalization at the bottom surface of each LED chip array. This ground is then coupled through an electrically conductive epoxy adhesive (28) to the metallic tile and then through a second conductive epoxy adhesive (30) to the metal mother board and thereafter to a ground strip 32 that forms a part of a power-ground bus bar. The ground strip is supported by the spreader board and includes a leg which attaches to the spreader board by a conductive adhesive or a solder connection. Leads on the circuit board formed in a predetermined layer thereof couple the ground strip to bond pads formed at the top surface of the spreader board adjacent the edge facing the driver chip arrays. Wire bonds are provided for connecting ground to the driver chip arrays. Two additional power strips are similarly attached to the spreader boards to provide power signals to the driver chip arrays.

A problem with such arrangement is that a poor ground connection may occur between the mother board and the tile and thereby affect the light output of the LEDs.

It is an object of the invention to overcome the problem set forth above.

SUMMARY OF THE INVENTION

The above and other objects which will become apparent are realized by a non-impact printhead which comprises an array that includes a plurality of recording elements; means incorporated in an integrated circuit driver chip provides electrical power for driving selected recording elements for recording; a spreader board has means defining electrical leads for distributing electrical power ground and control signals to the driver chip; a tile has supported on one face thereof the spreader board, the driver chip and the array; and means defines a ground path between the array and the spreader board, the ground path extending along the surface of the tile between the array and the spreader board.

BRIEF DESCRIPTION OF THE DRAWINGS

FIG. 3 is a top plan view of a portion of the printhead of the embodiment of FIG. 2; and FIG 4 is a schematic illustrating in cross-section a portion of a second embodiment of an LED printhead formed in accordance with the invention.

DETAILED DESCRIPTION OF THE PREFERRED EMBODIMENTS

Figure 1:
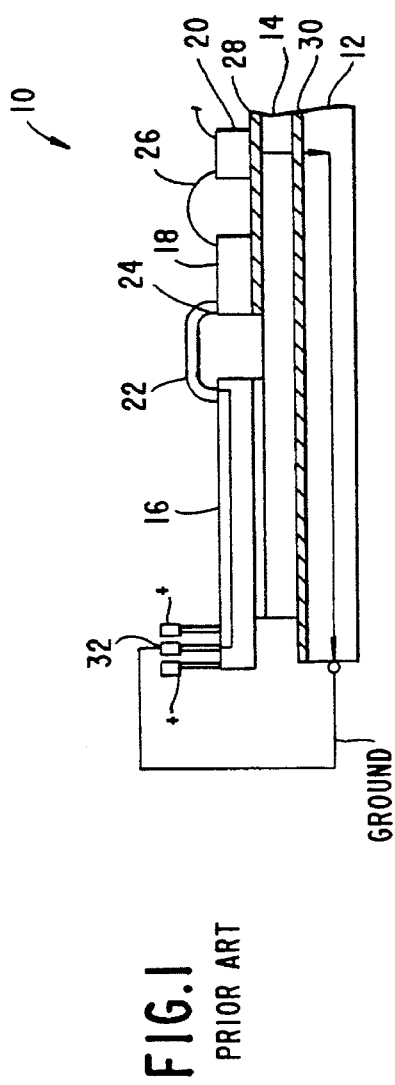
FIG. 1 is a schematic illustrating in cross-section a portion of a prior art LED printhead.
Figure 2:
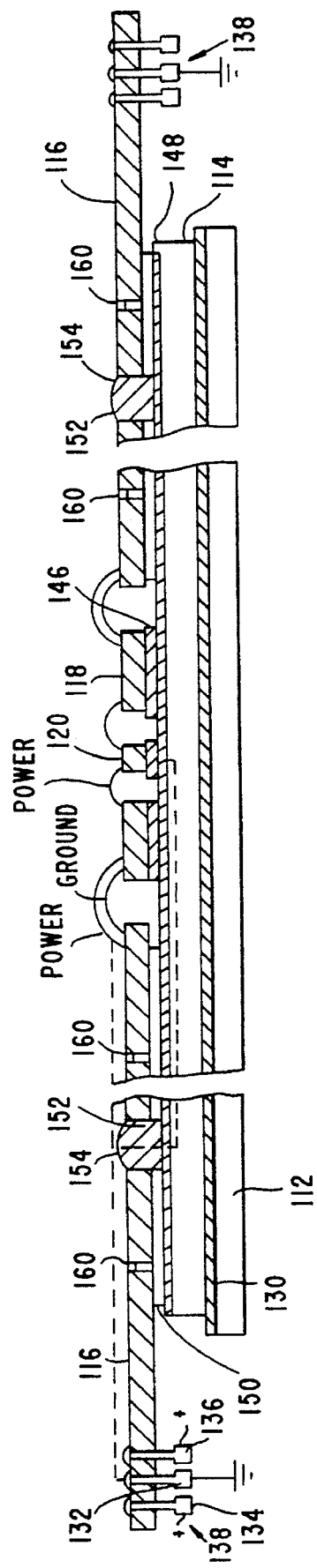
FIG. 2 is a schematic illustrating in cross-section along the line 2—2 of FIG. 3 a portion of one embodiment of an LED printhead formed in accordance with the invention.

With reference to FIGS. 2 and 3, an LED printhead (100) is formed of a plurality of LED chip arrays (120) arranged end to end. On each LED chip array, there may be say 96 or 128 LEDs arranged in a row with a uniform spacing therebetween. As may be seen in FIG. 3, only two modules (140) are illustrated, it being understood that there are others on the printhead in similar side to side arrangement with those shown to form a continuous line of several thousand LEDs. A typical module (140) includes a metal tile (114) to support the other components of the module. These other components include in this example three LED chip arrays arranged end to end and with three driver chip arrays (118) arranged on each side of the row of LEDs. Thus, two driver chip arrays are used to drive the LEDs on a single LED chip array with typically one driver chip array used to drive the odd-numbered LEDs and the other driver chip array used to drive the even-numbered LEDs. The driver chip arrays are connected to the LEDs via wire bonds (111) that are bonded to bond pads on the LED chip array. Leads formed on the LED chip array connect each bond pad to a respective LED. Only one wire bond is required between driver chip array and LED chip array for each LED and thus, as an example, 64 wire bonds will be provided between each driver chip array and its corresponding LED chip array, assuming there are 128 LEDs on this LED chip array.

Upon an outboard or second side of the driver chip array there is supported on the tile a spreader board (116). Each spreader board comprises a multilayer circuit board that comprises, as is well known, alternating conductive and insulative layers for connecting signals such as various clock, data and control signals as well as power supply and ground to the driver chips. As noted in the aforementioned publication, the signals may be distributed down the length of the printhead by daisy-chaining the spreader boards together by providing on each spreader board conductors that take entering signals input to bond pads on one side edge and conduct them to bond pads on the other side edge of the board, as well as conduct them to bond pads adjacent the three driver chip arrays that are served by that spreader board. The signals are then passed to an adjacent spreader board by wire bonds (142) connected between them for further dissemination to other modules and by wire bonds (144) that connect the latter bond pads to the driver chips of the instant module. The wire bonds (142, 144) illustrated in FIG. 3 are merely to illustrate the explanation provided, it being understood that many more wire bonds are present.

As may be seen in FIG. 2, the spreader boards (116) each extend beyond the outboard edges of the tile (114) and support a power-ground bus bar that runs the length of all of the printhead modules. The bus bar (138) may be comprised of three metallic strips (132, 134, 136). One strip is used to carry a potential $V_{DD}$ for powering the logic circuits on the driver chips. A second strip carries the potential $V_{cc}$ for powering the currents to the LEDs. The third strip (132) is for ground and is to conduct the ground currents from the driver chips and LEDs to an appropriate ground. The strips are separated by insulators and, as shown in FIG. 2, each includes a conductive leg which extends to each spreader board the potential on the strip. The legs are connected in an appropriate opening in the spreader board and conductive leads thereupon connect these strips with bond pads located on the inboard sides of the spreader board for connection to respective driver chips. The leads extend in different layers of the multilayer spreader board and these layers in turn are connected to the respective inboard bond pads. As noted schematically in FIG. 2, two wire bonds are shown for connecting respectively one of the inboard bond pads on the spreader board to a driver chip to provide a power connection and another for providing a ground connection. It will be appreciated, however, that other wire bonds exist for control, clock and data signals, and for the second power connection. In addition, extra wire bonds may be provided from plural pads for distributing the same power or ground signal to reduce resistance.

In the embodiment of FIGS. 2 and 3, the connection of the LEDs to the ground strip of the bus bar does not rely upon a good conductive connection between the LEDs and the tile. Indeed, the tile need not be electrically conductive entirely. As shown by the dotted lines in FIG. 2, the ground connection of the LEDs is through an electrically conductive epoxy adhesive layer (146) coated on the tile beneath the LED and driver chip arrays to a conductive coating layer (148) such as gold and/or nickel formed on the stainless steel tile. The adhesive layer is used to also structurally attach the LED and driver chip arrays to the tile. An insulating adhesive layer (150) placed on the tile (114) in the area for mounting the spreader board electrically insulates the bottom surface of the spreader board from this conductive coating layer (148). However, a via (152) is formed in or through the spreader board and a conductive adhesive such as of a conductive epoxy (154) fills this via and connects the conductive coating layer (148) with the upper surface of the spreader board. Appropriate conductive lead patterns are formed on the upper surface of the spreader board (as shown by the dotted lines in FIG. 2) to connect the via (152) with an adhesive connection of the grounded strip of the bus bar. It will also be noted from FIG. 3 that the insulating adhesive (150) is not formed in the area of the via (152) so that the electrically conductive adhesive (154) that fills the via forms an electrical connection with the conductive coating layer (148) on the tile. Since establishment of a common cathode ground is not predicated on electrical conductivity through the tile, the tile may be formed of ceramic that is coated with an electrically conductive layer. For example, the tile may be an aluminum nitride that has a sputtered gold coating layer. Between the gold and aluminum nitride substrate, an adhesive promoter may be provided such as titanium. The aluminum nitride tile while not being electrically conductive provides sufficient heat conductivity to a suitable heat sink not shown upon which the mother board is supported. A heat-conductive adhesive (130) attaches the mother board (112) to the tiles (114). Other vias (160) may be provided in the spreader board to provide communication of electrical signals between various layers.

In lieu of the via (152) connecting the grounded strip of the bus bar to the top surface of the spreader board (116) that is used as the ground layer, the ground layer may be made one of the intermediate layers of the multilayer spreader board and the via connect this intermediate ground layer with the conductive surface of the tile (114). As noted in the discussion of the prior art, a typical spreader board (except for those at the ends) serves to distribute signals it receives from daisy chain connections from a prior spreader board to the driver chips supported by that typical spreader board as well as to carry those signals to a daisy chain connected subsequent spreader board. Thus, the signals are required to be carried longitudinally in the longitudinal direction of the printhead, which is the direction defined by the row of LEDs for the daisy chain distribution, as well as transversely, the direction perpendicular to the longitudinal direction so as to convey these signals from the spreader board to the driver chips supported by that spreader board. The ground layer, when placed as an intermediate layer, may be located between two signal layers. In one signal layer conductors are provided for carrying say clock or other control signals for clocking data into data registers on the driver chips. In the other of the two signal layers conductors are provided for carrying data signals. The intermediate ground layer thus isolates the data signals from the clock signals and reduces interference between the two signal layers. Where sufficient number of layers are available, each of the signal layers may instead be split into two layers. One of those two layers has conductors directed in the longitudinal direction of the printhead, connecting bond pads (142) at one side edge of the spreader board, that inputs signals to the spreader board, and connecting same with bond pads at the opposite side edge of the spreader board for distribution to the next successive spreader board. The other of these two layers has conductors directed transversely to the longitudinal direction for carrying signals toward the bond pads at an end of the spreader board adjacent the driver chips for distribution over wire bonds 144 to these driver chips. The signal layers are connected to the bond pads on the top surface of the spreader board by vias which communicate with the top surface. As noted above, insulating layers separate conductive layers.

In the alternative embodiment of FIG. 4, similar numerals are used to refer to corresponding structure described for that of the embodiment of FIGS. 2 and 3 except that such numerals are followed by a prime ('). In the embodiment of FIG. 4, the tile (114') and mother board (112') both may be metallic for providing good heat conductivity where that is required. The tile and mother board are joined by a heat-conductive adhesive (130'). On the front face of the tile a heat and electrically-conductive epoxy adhesive (148') is coated on the surface and serves as an adhesive for joining or adhering each of the spreader boards, the driver chips and the LED chip arrays to the tile. The tile may be stainless steel and coated as is known with a nickel and/or gold coating (148'). Typically, it is conventional to apply a nickel coating to the tile and to overcoat the nickel coat with gold. In lieu of a metal tile, a ceramic tile having an electrically conductive coating may be provided.

The spreader board in the embodiment of FIG. 4 is provided on its back face with a conductive copper coating layer (162) that connects with the ground strip (132') of the bus bar. This conductive coating appears over the entire area of the spreader board except for isolated areas above which a via (160') is provided through the spreader board (116'). These isolated areas on the bottom surface of the spreader circuit board are coated with an electrically insulative coating and thus electrically isolate the via from the otherwise continuous conductive copper coating layer. The vias (160') in the spreader board are thus covered partially with the electrically insulative coating to isolate these vias which carry signals other than ground signals. Thus, in the embodiment of FIG. 4, the LED chip arrays (120') and spreader boards (116') are electrically connected through the conductive epoxy and conductive gold layer to the ground strip (132') and good electrical conductivity of the tile is not essential. Thus, the tile substrate in this embodiment may also be formed of a ceramic that is not electrically conductive except for conductive coatings thereon.

The invention has been described in detail with particular reference to preferred embodiments thereof, but it will be understood that variations and modifications can be effected within the spirit and scope of the invention.

I claim:

1. A non-impact printhead comprising:
   an array including a plurality of recording elements;
   means incorporated in an integrated circuit driver chip for generating electrical currents to drive selected ones of said recording elements;
   means, including a spreader board having electrical leads, for distributing electrical power, ground and control signals to the driver chip;
   a tile having supported on one face thereof the spreader board, the driver chip and the array; and
   means defining a ground path between the array and the spreader board, the ground path extending along the face of the tile between the array and the spreader board;
   wherein the spreader board includes an electrically conductive via that extends from a back face of the spreader board that is adhered to the tile and the via is filled with an electrically conductive material that electrically connects the via to the tile;
   wherein the via extends to an intermediate layer of the spreader board and the intermediate layer is between a first conductive layer of the spreader board that includes means for carrying control signals and a second conductive layer of the spreader board that includes means for carrying data signals.

2. The printhead of claim 1, and wherein the tile is a ceramic that is coated with an electrically conductive coating and wherein the electrically conductive coating extends between the via and the array and provides a conductive path for ground along a coating path between the array and the via.

3. The printhead of claim 2, and wherein a ground strip is supported upon the spreader board and the ground strip is electrically connected by electrical leads located on the board to the via.

4. The printhead of claim 1, and wherein a ground strip is supported upon the spreader board and the ground strip is electrically connected by electrical leads located on the board to the via.

5. A non-impact printhead comprising:
   an array including a plurality of recording elements;
   means incorporated in an integrated circuit driver chip for generating electrical currents to drive selected ones of said recording elements;
   means, including a spreader board having electrical leads, for distributing electrical power, ground and control signals to the driver chip;
   a tile having separately supported on one face thereof, in spaced relationship from each other, the spreader board, the driver chip and the array; and
   means defining a ground path between the array and the spreader board, the ground path extending along the face of the tile between the array and the spreader board;
   wherein the spreader board includes an electrically conductive via that extends from a back face of the spreader board that is adhered to the face of the tile and the via is filled with an electrically conductive material that electrically connects the via to the ground path on the face of the tile; and
   wherein a bus bar ground strip is supported upon the spreader board and the ground strip is electrically connected by electrical leads located on the board to the via whereby the array is grounded to the ground strip through the via.

6. The printhead of claim 5, wherein the via extends to an intermediate layer of the spreader board and the intermediate layer is between a first conductive layer of the spreader board that includes means for carrying control signals and a second means conductive layer of the spreader board that includes means for carrying data signals.

7. The printhead of claim 5, wherein the tile is a ceramic that is coated with an electrically conductive coating and wherein the electrically conductive coating extends between the via and the array and provides a conductive path for ground along a coating path between the array and the via.

8. The printhead of claim 7, wherein the via extends to an intermediate layer of the spreader board and the intermediate layer is between a first conductive layer of the spreader board that includes means for carrying control signals and a second conductive layer of the spreader board that includes means for carrying data signals.

9. A non-impact printhead comprising:
   an array including a plurality of recording elements;
   means incorporated in an integrated circuit driver chip for generating electrical currents to drive selected recording elements;
   means, including a spreader board having electrical leads, for distributing electrical power, ground and control signals to the driver chip spreader board including an electrically conductive coating on a back face thereof;
   a tile having separately supported on one face thereof, in spaced relationship from each other, the spreader board, the driver chip and the array; and
   means defining a ground path between the array and the coating on the back face of the spreader board, the ground path extending along the face of the tile between the array and the spreader board;
   wherein the spreader board includes an electrically conductive via that extends from a front face of the spreader board and the via is filled with an electrically conductive material that electrically connects the via to a signal layer other than ground in the spreader board;
   a ground strip is supported upon the spreader board and electrically connected to the conductive coating on the back face of the spreader board; and wherein the via is electrically insulated from the coating on the back face of the spreader board.

10. The printhead of claim 9, and wherein the tile is a ceramic that is coated with an electrically conductive coating and wherein the electrically conductive coating extends between the spreader board and the array and provides a conductive path for ground along a path between the array and the spreader board.

* * * * *